(12) United States Patent
Hsu

(10) Patent No.: US 7,902,640 B2
(45) Date of Patent: Mar. 8, 2011

(54) DIELECTRIC LAYER AND THIN FILM TRANSISTOR

(75) Inventor: Chieh-Chou Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 446 days.

(21) Appl. No.: 11/864,934

(22) Filed: Sep. 29, 2007

(65) Prior Publication Data

US 2008/0308821 A1      Dec. 18, 2008

(30) Foreign Application Priority Data

Jun. 12, 2007   (TW) .................................. 96121163

(51) Int. Cl.
    *H01L 29/786* (2006.01)
(52) U.S. Cl. .......................... 257/640; 257/649; 257/59; 257/72; 257/E21.293; 257/E29.273
(58) Field of Classification Search ............... 257/59, 257/72, 640, 649, E29.273, E21.293, E21.267, 257/E21.269; 438/149, 151, 154, 161, 791
    See application file for complete search history.

(56) References Cited

U.S. PATENT DOCUMENTS

| | | | |
|---|---|---|---|
| 5,272,360 A * | 12/1993 | Todoroki et al. ............. | 257/60 |
| 6,291,255 B1 | 9/2001 | Huang et al. | |
| 6,372,672 B1 * | 4/2002 | Kim et al. .................... | 438/791 |
| 6,573,172 B1 | 6/2003 | En et al. | |
| 6,887,745 B2 | 5/2005 | Chen et al. | |
| 6,900,853 B2 * | 5/2005 | Watanabe et al. ............. | 349/43 |
| 7,019,352 B2 * | 3/2006 | Udayakumar et al. ....... | 257/310 |
| 7,019,385 B1 | 3/2006 | Zhang et al. | |
| 2001/0028099 A1 | 10/2001 | Sato | |
| 2008/0241355 A1 * | 10/2008 | Won et al. ..................... | 427/58 |

FOREIGN PATENT DOCUMENTS

| | | |
|---|---|---|
| CN | 1458694 | 11/2003 |
| JP | 2000321095 | 11/2000 |
| JP | 2003142496 | 5/2003 |
| JP | 2006049535 | 2/2006 |
| TW | 332320 | 5/1998 |
| TW | 381122 | 2/2000 |
| TW | 487978 | 5/2002 |
| TW | 513799 | 12/2002 |
| TW | 556033 | 10/2003 |
| TW | 200525638 | 8/2005 |
| TW | 1241863 | 10/2005 |
| TW | 1251876 | 3/2006 |

* cited by examiner

*Primary Examiner*—Victor Mandala
*Assistant Examiner*—Scott Stowe
(74) *Attorney, Agent, or Firm*—Jianq Chyun IP Office

(57) ABSTRACT

A dielectric layer including a film with silicon compound contain oxygen and a film with silicon compound contain nitrogen is provided. A ratio of Si—N group absorption intensity to a thickness of the film with silicon compound contain nitrogen in an FTIR spectrum is substantially greater than or substantially equal to $0.67/\mu m$. The dielectric layer can be incorporated in switch devices.

36 Claims, 3 Drawing Sheets

DIELECTRIC LAYER AND THIN FILM TRANSISTOR

CROSS-REFERENCE TO RELATED APPLICATION

This application claims the priority benefit of Taiwan application serial no. 96121163, filed Jun. 12, 2007. All disclosure of the Taiwan application is incorporated herein by reference.

BACKGROUND OF THE INVENTION

1. Field of the Invention

The present invention relates to a dielectric layer and a thin film transistor, and more particularly, to a high-quality dielectric layer and a thin film transistor having the dielectric layer.

2. Description of Related Art

The thin film transistor liquid crystal display (TFT-LCD) has become the mainstream among various flat panel displays because of its superior characteristics such as high resolution, good space usage, low power consumption and free of radiation. Especially, when fabricating a TFT-LCD, a superior film-forming technology of a gate insulation film can enhance the electrical characteristics of the TFT.

In a conventional fabricating process of the polysilicon TFT, an amorphous silicon (a-Si) layer is re-crystallized as a polysilicon layer after a laser annealing process. Afterwards, a gate insulation film is formed to cover the polysilicon layer. Next, a gate is formed on the gate insulation film over the polysilicon layer. In the polysilicon TFT, both the polysilicon layer served as device channel layers and the gate insulation film are important factors which affect the electrical characteristics. Especially after a subsequent ion implantation process, grain boundary traps, traps of an oxide layer, and interface trap states between the polysilicon layer and the gate insulation layer increase, and dangling bonds are generated in the gate insulation film. As a result, probability of charged particles being confined within the gate insulation layer are increased, which in turn deteriorates the electrical characteristics.

In view of the above-mentioned, it becomes rather difficult to further improve the electrical characteristics of the polysilicon TFT during the conventional polysilicon TFT fabricating process.

SUMMARY OF THE INVENTION

Accordingly, the present invention provides a dielectric layer which allows a thin film transistor (TFT) to have superior electrical characteristics.

The present invention further provides a TFT having the above-mentioned dielectric layer.

The present invention is directed to a display panel having the above-mentioned TFT.

The present invention is directed to an electro-optical device having the above-mentioned display panel.

As embodied and broadly described herein, a dielectric layer including a film with a silicon compound containing oxygen and a film with a silicon compound containing nitrogen is provided. The film with a silicon compound containing nitrogen is disposed on the film with a silicon compound containing oxide. In an Fourier transformation infrared (FTIR) spectrum of the film with silicon compound contain nitrogen, a ratio of Si—N group absorption intensity to a thickness of the film with a silicon compound containing nitrogen is substantially greater than or substantially equal to 0.67/μm.

The present invention further provides a TFT including a substrate, an active layer, a first dielectric layer, a gate, a second dielectric layer, a source/drain electrode, a third dielectric layer and a pixel electrode. The active layer is disposed on the substrate and has a source region, a drain region and a channel region located between the source region and the drain region. The first dielectric layer is disposed on the substrate to cover the active layer. The gate is disposed on a portion of the first dielectric layer. The second dielectric layer is disposed on the substrate to cover the gate. The source/drain electrode is disposed on a portion of the second dielectric layer and electrically connected to the source region and drain region of the active layer. The third dielectric layer is disposed on the substrate to cover the source/drain electrode. The pixel electrode is disposed on a portion of the third dielectric layer and electrically connected to the source/drain electrode. At least one of the first dielectric layer, the second dielectric layer, and the third dielectric layer comprises a film with a silicon compound containing oxygen and a film with a silicon compound containing nitrogen. In an FTIR spectrum of the film with a silicon compound containing nitrogen, a ratio of Si—N group absorption intensity to a thickness of the film with a silicon compound containing nitrogen is substantially greater than or substantially equal to 0.67/μm.

The present invention further provides a display panel including the above-mentioned TFTs and a plurality of signal lines electrically connected to the aforesaid TFTs.

The present invention further provides a electro-optical device including the above-mentioned display panel.

Current process parameters are modified in the present invention to adjust the film with silicon compound contain nitrogen in the dielectric layer so that the film with silicon compound contain nitrogen in a film analysis of the FTIR spectrum conforms to a certain relation. When the dielectric layer is applied in the TFT, the electrical characteristics of the TFT are improved. Hence, the dielectric layer disclosed by the present invention improves the electrical characteristics of the TFT without increasing additional fabricating cost.

In order to make the aforementioned and other objects, features and advantages of the present invention more comprehensible, preferred embodiments accompanied with figures are described in detail below.

DESCRIPTION OF EMBODIMENTS

The present invention provides a gate insulation film as an example. When the gate insulation film is applied in a switch device, such as a polysilicon thin film transistor (TFT), it can improve electrical characteristics of the TFT. However, the present invention is not limited to the example, and the gate insulation film can be further optionally applied to at least one of an etching stop layer, a buffer layer, an interior dielectric layer and a protection layer in the TFT. Generally, the quality of the gate insulation film affects the electric performance of a TFT, especially grain boundary traps in a silicon layer, traps of a layer with a silicon compound containing oxygen such as a silicon oxide layer, interface trap states between the silicon layer and a gate insulation layer, and dangling bonds of the gate insulation film. To solve the aforementioned problems, the present invention provides a dielectric layer which helps repair the traps caused during the fabricating process in the aforesaid dielectric layers.

First Embodiment

Figure 1:
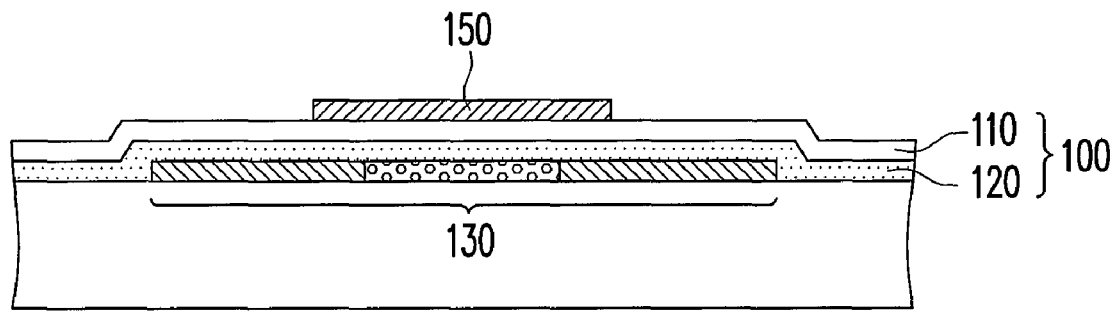
FIG. 1 is a schematic view of a gate insulation film applied in a polysilicon thin film transistor (TFT).

FIG. 1 is a schematic view of a dielectric layer of the present invention applied in a TFT. Referring to FIG. 1, a dielectric layer 100 including a film with a silicon compound containing oxygen 120 and a film with a silicon compound containing nitrogen 110. In the present embodiment of the invention, the film with a silicon compound containing oxygen is a silicon oxygen film and the film with a silicon compound containing nitrogen is a silicon nitride film is used as an example, but is not limited to it. In the present embodiment, the film with a silicon compound containing nitrogen 110 are formed by a chemical vapor deposition (CVD) process by using a nitrogen-based gas, such as $N_2O$, and a silicon-based gas, such as $SiH_4$, as reactive gases. The present embodiment is not limited to the reactive gases recited herein. Other reactive gases may be optionally used, specifically, the nitrogen-based gases may be nitrogen, ammonia, a gas/ammonia mixture, a nitrogen/$N_2O$ mixture, $N_2O$, other gases, or any mixture of the aforesaid gases, while the silicon-based gases may be disilane, tertramethyl-silane (4MS), tertramethyloxysilane, tetraethosiloxane (TEOS), other gases or any mixture of the aforesaid gases. An interior structure of the silicon nitride film 110 is altered by adjusting process parameters while forming the silicon nitride film 110 so that preferably a ratio of Si—N group absorption intensity to a thickness of the silicon nitride film 110 in an FTIR spectrum is substantially greater than 0.67/μm, or can be the ratio of Si—N group absorption intensity to a thickness of the silicon nitride film 110 in an FTIR spectrum is substantially equal to 0.67/μm, but not limited to this value. A bonding proportion of silicon, nitrogen and hydrogen in the silicon nitride film 110 is conducive to repairing film defects caused during an original fabricating process so as to enhance electrical characteristics.

Additionally, in the present embodiment, the silicon nitride film 110 is disposed on the silicon oxide film 120. In other embodiments, the silicon oxide film 120 may also be disposed on the silicon nitride film 110. Further, other embodiments may optionally use only the silicon nitride film 110 disclosed in the present invention to increase throughput of mass production. In other words, the dielectric layer in the present invention at least includes the silicon nitride film recited in the present embodiment and whether more than two layers of films are used is determined by requirements such as reliability and electric performance. If two films are required, the dielectric layer may include two silicon nitride films, or may include one silicon oxide film and one silicon nitride film. If three films are required, the dielectric layer may include three silicon nitride films. Alternatively, the dielectric layer may include two silicon oxide films and one silicon nitride film, so as to form an oxide/nitride/oxide (ONO), an oxide/oxide/nitride (OON), or an oxide/nitride/nitride (ONN) stacked layer structure. Additionally, other stacked layer structures may be used.

Figure 1A:
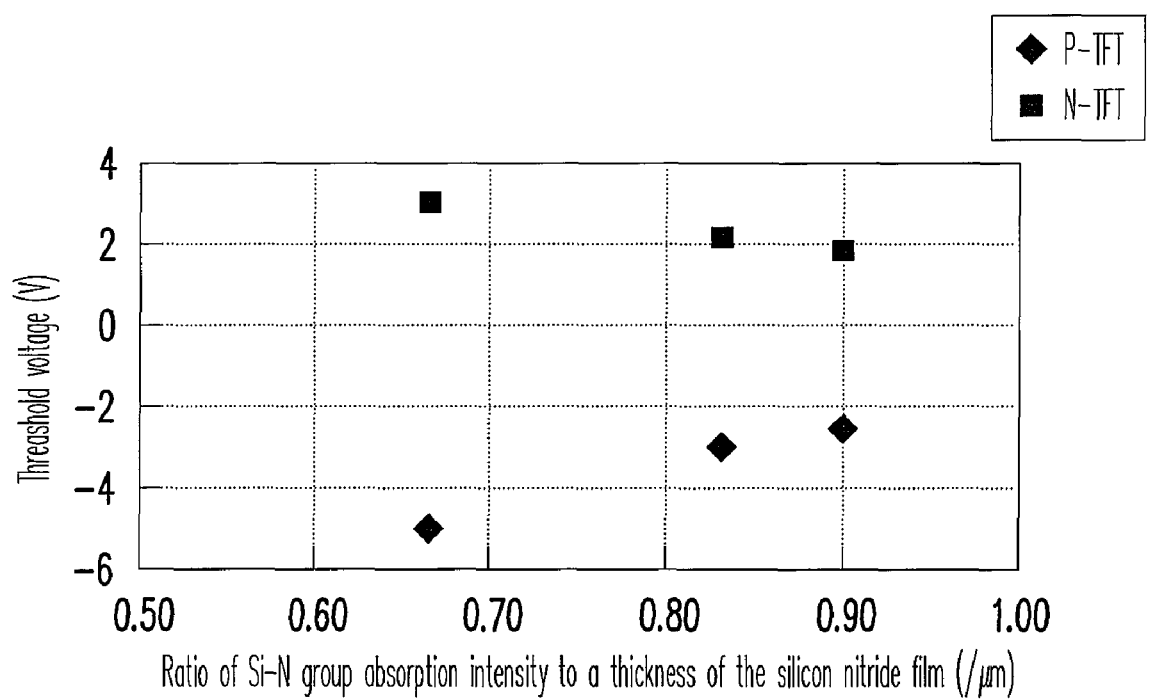
FIG. 1A is a curve diagram illustrating how threshold voltages of an N-type TFT and a P-type TFT fluctuate as ratios of Si—N group absorption intensity to a thickness of the silicon nitride film vary in a Fourier transformation infrared (FTIR) spectrum.
Figure 1B:
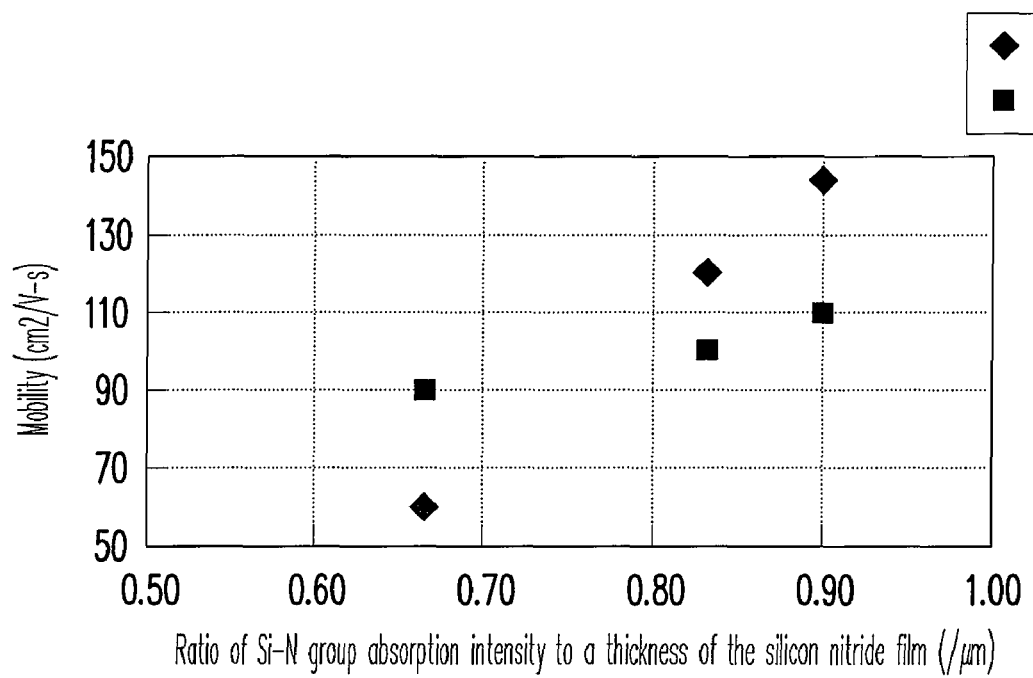
FIG. 1B is a curve diagram illustrating how mobility of an N-type TFT and a P-type TFT fluctuates as ratios of Si—N group absorption intensity to a thickness of the silicon nitride film vary in a Fourier transformation infrared (FTIR) spectrum.

Specifically, a chemical bonding and composition of the silicon nitride film 110 can be known from the FTIR spectrum, such as Si—N group, Si—H group, Ni—H group and H—H group, and proportions of elements in the film including a proportion of hydrogen atoms can be thereby inferred. As illustrated in FIG. 1, when the silicon nitride film 110 conforms to the above formula, a certain proportion of hydrogen atoms are included in the silicon nitride film. Since the size of the hydrogen atoms is smaller than that of the nitrogen atoms, the hydrogen atoms are easier to be released in the subsequent fabricating process. A portion of the hydrogen atoms are diffused towards a silicon layer 130 so as to repair grain boundary traps, and/or a small portion of the hydrogen atoms still remain inside the dielectric layer 100 and are bonded with dangling bonds therein. As a result, probability of charged particles being confined within the dielectric layer 100 are reduced, and the electrical characteristics of the TFT are accordingly improved. However, if the hydrogen atoms are insufficient to repair the traps and/or dangling bonds, nitrogen atoms will repair the remaining traps and/or dangling bonds. For example, FIGS. 1A and 1B are curve diagrams respectively illustrating how threshold voltages and mobility of an N-type thin film transistor (N-TFT) and a P-type thin film transistor (P-TFT) fluctuate as ratios of Si—N group absorption intensity to a thickness of the silicon nitride film vary in a Fourier transformation infrared (FTIR) spectrum. Furthermore, polysilicon TFTs are taken in FIGS. 1A and 1B as examples. Generally, electric characteristics of a TFT vary as different design requirements. An optimal condition where a threshold voltage is about zero also means that the TFT is easier to be turned on. Referring to FIG. 1A, the threshold voltages of the N-TFT and the P-TFT vary as ratios of Si—N group absorption intensity to a thickness of the silicon nitride film vary in the FTIR spectrum. It can be known that when the ratio of Si—N group absorption intensity to the thickness of the silicon nitride film in the FTIR spectrum is substantially greater than or substantially equal to 0.67/μm (as illustrated in FIGS. 1A and 1B), the threshold voltage of the TFT decreases with the ratio as well, i.e., gradually approaches zero. Consequently, the carrier mobility in the TFT significantly increases significantly so as to improve the electrical characteristics of the TFT.

In the silicon nitride film 120 being adjusted in the present embodiment, a refractive index of the silicon nitride film 120 is substantially greater than 1.8 when a predetermined test wavelength is, for example but not limited to, about 633 nanometers (nm). A better refractive index ranges from, for example, between about 1.84 to about 2, can be including about 1.84 and about 2, but not limited to this value. Preferably, a shrinkage stress of the silicon nitride film 120 may be range from about 115 MPa to about −425 MPa, can be including about 115 MPa and about −425 MPa, but not limited to this value.

Ultimately, a conductive layer 150 is formed on the dielectric layer. When the conductive layer 150 and the dielectric layer 100 are applied in the TFT, the conductive layer functions as a gate, and the dielectric layer 100 functions as a gate insulation film.

Second Embodiment

The embodiment provides a TFT 200 including a substrate 202, an active layer 210, a first dielectric layer 220, a gate 250, a second dielectric layer 260, a source region 212/drain region 214, a third dielectric layer 290 and a pixel electrode 292. The active layer 210 is disposed on the substrate 202. The active layer 210 has a source region 212, a drain region 214 and a channel region 216 located between the source region 212 and the drain region 214. The first dielectric layer 220 is disposed on the substrate 202 to cover the active layer 210. The gate 250 is disposed on a portion of the first dielectric layer 220. The second dielectric layer 260 is disposed on the substrate 202 to cover the gate 250. The source 270/drain 280 is disposed on a portion of the second dielectric layer 260 and electrically connected to the source region 212/drain region 214 of the active layer 210. The third dielectric layer 290 is disposed on the substrate 202 to cover the source 270/drain 280. The pixel electrode 292 is disposed on a portion of the third dielectric layer 290 and electrically connected to the source 270/drain 280. The first dielectric layer 220, the second dielectric layer 260 and the third dielectric layer 290 are applied in the TFT, and therefore they can be respectively termed as a gate insulation film, an interlayer dielectric layer, and a passivation layer.

Figure 2:
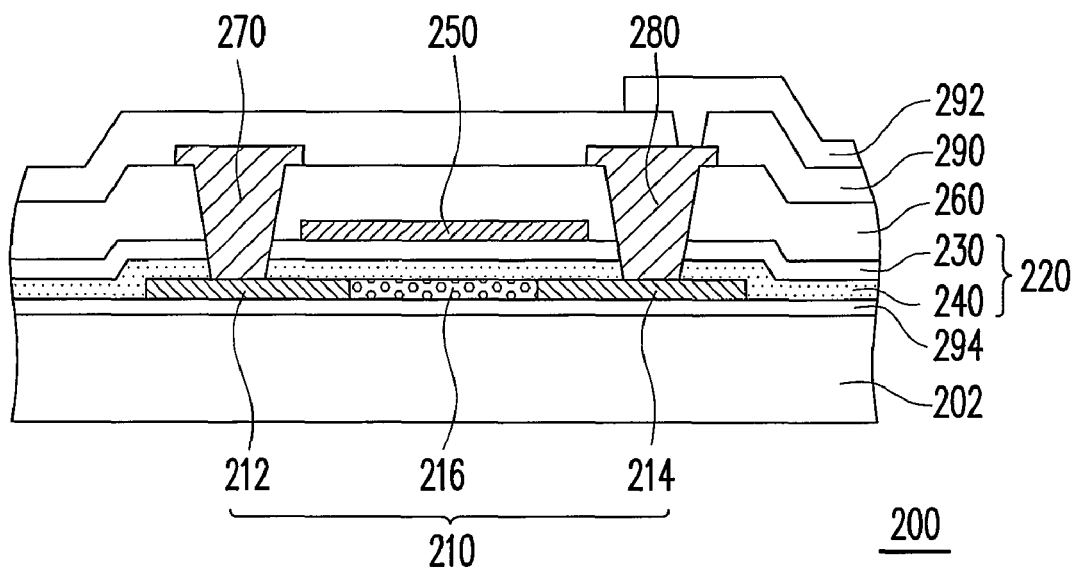
FIG. 2 is a schematic view illustrating a TFT of the present invention.

Referring to FIG. 2, at least one of the first dielectric layer 220, the second dielectric layer 260, and the third dielectric layer 290 includes a film within a silicon compound containing oxygen 230 and a film with a silicon compound containing nitrogen 240. In the present embodiment of the invention, the film with a silicon compound containing oxygen is a silicon oxygen film and the film with a silicon compound containing nitrogen is a silicon nitride film is used as an example, but is not limited to it. In an FTIR spectrum of the silicon nitride film 240, preferably, a ratio of Si—N group absorption intensity to a thickness of the silicon nitride film 240 is substantially greater than or substantially equal to 0.67/μm, but not limited to this value. In the present embodiment, the first dielectric layer 220 having a silicon oxide film 230 and a silicon nitride film 240 is used as an example. However, the present embodiment is not limited to the example and may optionally use only the silicon nitride film 240. In other words, at least one of the first dielectric layer 220, the second dielectric layer 260, and the third dielectric layer 290 in the present invention includes at least one silicon nitride film recited in the present embodiment. Whether more than two layers of films are used is determined by requirements such as reliability and electric performance of devices. If two films are required, the dielectric layer may include two silicon nitride films, or may include one silicon oxide film and one silicon nitride film. If three films are required, the dielectric layer may include three silicon nitride films. Alternatively, the dielectric layer may include two silicon oxide films and one silicon nitride film, so as to form an oxide/nitride/oxide (ONO), an oxide/oxide/nitride (OON), or an oxide/nitride/nitride (ONN) stacked layer structure. Additionally, other stacked layer structures may be used. Additionally, as illustrated in FIG. 2, the silicon oxide film 230 is disposed on the silicon nitride film 240. In other embodiments, the silicon nitride film 240 may also be disposed on the silicon oxide film 230.

Moreover, when the TFT 200 is applied in a panel, a plurality of signal lines (not illustrated) are electrically connected to the source 270 of the TFT 200, and a data voltage (not labeled) is inputted to the source 270 through the signal lines. Carriers would transmit through the channel region 216 to the drain 280 so as to render the TFT in a switch-on state. Mobility (cm2/V-s) of the carriers is closely related to an interior structure of the active layer 210. In the present embodiment, the silicon nitride film 240 conforming to the said condition has a certain proportion of hydrogen atoms therein. Since the size of the hydrogen atoms is smaller than that of the nitrogen atoms, the hydrogen atoms are easier to be released in the subsequent fabricating process. A portion of the hydrogen atoms would diffuse downwards to the channel region 216 first to repair grain boundary traps so as to improve a transmission efficiency of the carriers in the TFT 200, and/or a small portion of the hydrogen atoms still remain inside the dielectric layer 220 and are bonded with dangling bonds in the silicon nitride film 240 to repair the traps, reduce leakage current of the TFT 200 and improve the electrical characteristics thereof. However, if the hydrogen atoms are insufficient to repair the traps and/or dangling bonds, nitrogen atoms would repair the remaining traps and/or dangling bonds.

In the silicon nitride film 240 being adjusted in the present embodiment, a refractive index of the silicon nitride film 240 is substantially greater than 1.8 when a predetermined test wavelength is, for example but not limited to, about 633 nanometers (nm). A better refractive index ranges from, for example, about 1.84 to about 2, can be including about 1.84 and about 2, but not limited to this value. Preferably, a shrinkage stress of the silicon nitride film 240 may be range from about 115 MPa to about −425 MPa, can be including about 115 MPa and about −425 MPa, but not limited to this value.

In the present embodiment, the TFT 200 further includes a buffer layer 294 disposed on the substrate 202. Furthermore, in an alternative embodiment, the buffer layer 294 includes a film within a silicon compound containing oxygen and a film within a silicon compound containing nitrogen. In the FTIR spectrum of the film within a silicon compound containing nitrogen a ratio of Si—N group absorption intensity to a thickness of the film within a silicon compound containing nitrogen may be substantially greater than or substantially equal to 0.67/μm.

A top-gate TFT is used in the present embodiment as an example, and other types of top-gate TFTs may also be used as well.

Third Embodiment

Figure 3:
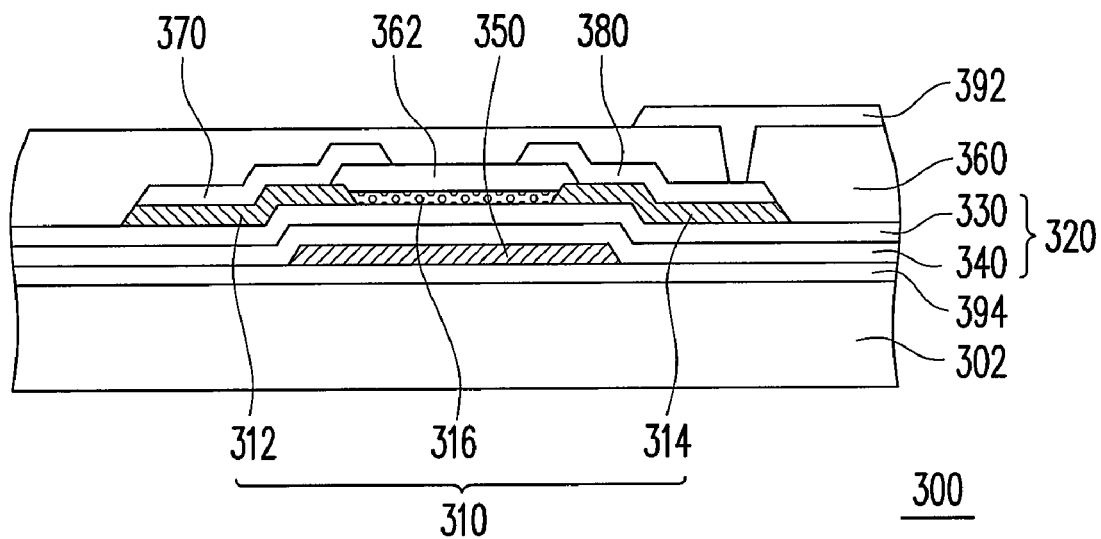
FIG. 3 is a schematic view illustrating another TFT of the present invention.

FIG. 3 is a schematic view illustrating another TFT of the present invention. Referring to FIG. 3, a TFT 300 includes a substrate 302, a gate 350, a first dielectric layer 320, an active layer 310, a source 370/drain 380, a second dielectric layer 360, and a pixel electrode 392. The gate 350 is disposed over a substrate 302. The first dielectric layer 320 is disposed over the substrate 302 to cover the gate 350. The active layer 310 is disposed on a portion of the first dielectric layer 320. The active layer 310 has a source region 312, a drain region 314, and a channel region 316 located between the source region 312 and the drain region 314. The source 370/drain 380 is electrically connected to the source region 312/drain region 314 of the active layer 310. The second dielectric layer 360 is disposed over the substrate 302 to cover the source 370/drain 380, the active layer 310 and the first dielectric layer 320. The pixel electrode 392 is disposed on a portion of the second dielectric layer 360 and electrically connected to the source 370/drain 380.

Still referring to FIG. 3, at least one of the first dielectric layer 320 and the second dielectric layer 360 includes a film within a silicon compound containing oxygen 330 and a film within a silicon compound containing nitrogen 340. In the present embodiment of the invention, the film with a silicon compound containing oxygen is a silicon oxygen film and the film with a silicon compound containing nitrogen is a silicon nitride film is used as an example, but is not limited to it. A ratio of Si—N group absorption intensity to a thickness of the silicon nitride film 340 in an FTIR spectrum of the silicon nitride film 340 is substantially greater than or substantially equal to 0.67/μm. In the present embodiment, the first dielectric layer 320 having the silicon oxide film 330 and the silicon nitride film 340 is used as an example. However, the present embodiment is not limited to the example and may optionally use only the silicon nitride film 340. In other words, at least one of the first dielectric layer 320 and the second dielectric layer 360 in the present invention includes at least one silicon nitride film recited in the present embodiment. Whether more than two layers of films are used is determined by requirements such as reliability and electric performance of devices. If two films are required, the dielectric layer 320 or 360 may include two silicon nitride films, or may include one silicon oxide film and one silicon nitride film. If three films are required, the dielectric layer 320 or 360 may include three silicon nitride films. Alternatively, the dielectric layer 320 or 360 may include two silicon oxide films and one silicon nitride film, so as to form an oxide/nitride/oxide (ONO), an oxide/oxide/nitride (OON), or an oxide/nitride/nitride (ONN) stacked layer structure. Additionally, other stacked layer structures may be used Additionally, as illustrated in FIG. 3, the silicon oxide film 330 is disposed on the silicon nitride film 340. In other embodiments, the silicon nitride film 340 may also be disposed on the silicon oxide film 330.

The same as the TFT 200 of the second embodiment, the first dielectric layer 320 of the present embodiment conforming to the above conditions can improve the electrical characteristics of the TFT 300.

Additionally, in the present embodiment, a refractive index of the silicon nitride film 340 is substantially greater than 1.8 when a predetermined test wavelength is approximately, for example but not limited to, about 633 nanometers (nm). A better refractive index ranges from, for example, about 1.84 to about 2, can be including about 1.84 and about 2, but not limited to this value. Preferably, a shrinkage stress of the silicon nitride film 340 may be ranges from about 115 MPa to about −425 MPa, can be including about 115 MPa and about −425 MPa, but not limited to this value.

Moreover, in the present embodiment, the TFT 300 further includes an etching stop layer 362 disposed under a portion of the source 370/drain 380 and substantially corresponding to the gate 350. In one embodiment, the etching stop layer 362 including a film within a silicon compound containing oxygen and a film within a silicon compound containing nitrogen. In the present embodiment of the invention, the film with a silicon compound containing oxygen is a silicon oxygen film and the film with a silicon compound containing nitrogen is a silicon nitride film is used as an example, but is not limited to it. However, the present embodiment is not limited to the example and may optionally use only one silicon nitride film. In other words, whether more than two layers of films are used in the etching stop layer 362 of the present invention can be determined by requirements such as reliability and electric performance. If two films are required, the etching stop layer 362 may include two silicon nitride films, or may include one silicon oxide film and one silicon nitride film. If three films are required, the etching stop layer 362 may include three silicon nitride films. Alternatively, the etching stop layer 362 may include two silicon oxide films and one silicon nitride film, so as to form an oxide/nitride/oxide (ONO), an oxide/oxide/nitride (OON), or an oxide/nitride/nitride (ONN) stacked layer structure. Additionally, other stacked layer structures may be used Preferably, a ratio of Si—N group absorption intensity to a thickness of the silicon nitride film 340 in the FTIR spectrum of the silicon nitride film 340 is substantially greater than or substantially equal to 0.67/μm. In addition, the silicon nitride film is disposed on the silicon oxide film. In another embodiment, the silicon oxide film may be disposed on the silicon nitride film.

In one embodiment of the present invention, the TFT 300 further includes a buffer layer 394 disposed on the substrate 302. The buffer layer 394 including a film within a silicon compound containing oxygen and a film within a silicon compound containing nitrogen. In the present embodiment of the invention, the film with a silicon compound containing oxygen is a silicon oxygen film and the film with a silicon compound containing nitrogen is a silicon nitride film is used as an example, but is not limited to it. The embodiment may optionally use the silicon nitride film and/or the silicon oxide film. In other words, whether more than two layers of films are used in the buffer layer 394 of the present invention can be determined by requirements such as reliability and electric performance. If two films are required, the buffer layer 394 may include two silicon nitride films, or may include one silicon oxide film and one silicon nitride film. If three films are required, the buffer layer 394 may include three silicon nitride films. Alternatively, the buffer layer 394 may include two silicon oxide films and one silicon nitride film, so as to form an oxide/nitride/oxide (ONO), an oxide/oxide/nitride (OON), or an oxide/nitride/nitride (ONN) stacked layer structure. Additionally, other stacked layer structures may be used Preferably, a ratio of Si—N group absorption intensity to a thickness of the silicon nitride film in the FTIR spectrum of the silicon nitride film is substantially greater than or substantially equal to 0.67/μm. Moreover, if a silicon nitride film and a silicon oxide film are used as a buffer layer, the silicon nitride film may be disposed on the silicon oxide film. In another embodiment, the silicon oxide film may also be disposed on the silicon nitride film. When the TFT 300 is applied in a panel and a plurality of signal lines (not illustrated) are electrically connected to the source 370 of the TFT 300, a data voltage (not labeled) is inputted to the source 370 through the signal lines. Carriers would transmit through the channel region 316 to the drain 380 so as to render the TFT in a switch-on state.

Further, a bottom-gate TFT is used in the present embodiment as an example, and other types of bottom-gate TFTs may also be used as well.

In summary, current process parameters are used to adjust the silicon nitride film in the dielectric layer. Hence, no additional fabricating cost is required. When the silicon nitride film in the FTIR spectrum analysis conforms to a certain formula, the hydrogen atoms in the silicon nitride film take up a certain proportion. Since the size of the hydrogen atoms is smaller than that of the nitrogen atoms, the hydrogen atoms are easier to be released in the subsequent fabricating process. A portion of the released hydrogen atoms would diffuse towards the active layer first, repair the grain boundary traps and thereby improve the mobility of the carriers in the device and lower a threshold voltage (Vth) of the device, and/or a small portion of the hydrogen atoms would remain inside the dielectric layer and bond with the dangling bonds in the silicon nitride film so as to reduce the probability of the charged particles being confined within the dielectric layer.

However, if the hydrogen atoms are insufficient to repair the traps and/or dangling bonds, nitrogen atoms would repair the remaining traps and/or dangling bonds.

Materials of the active layer and the silicon layers recited in the foregoing embodiments include amorphous silicon, polysilicon, micro-silicon, mono-silicon, or others, or any combination of the above-mentioned. Further, a material of at least one of the conductive layer, the gate, the source, the drain, the pixel electrode includes a transparent material (such as indium tin oxide, indium zinc oxide, cadmium tin oxide, aluminum zinc oxide, hafnium oxide, other materials or any combination of the aforementioned), a reflective material (such as gold, silver, copper, iron, tin, lead, aluminum, molybdenum, neodymium, cadmium, titanium, tantalum, chromium, other materials, the aforesaid nitrides, the aforesaid oxides, the aforesaid oxynitrides, the aforesaid alloys, or any combination of the aforementioned), or any combination of the aforementioned. A single-gate TFT is used in the above-mentioned embodiment as an example, but the embodiment is not limited to the example. A double-gate TFT, a three-gate TFT, a four-gate TFT, or other types of gate TFTs may be used as well.

Figure 4:
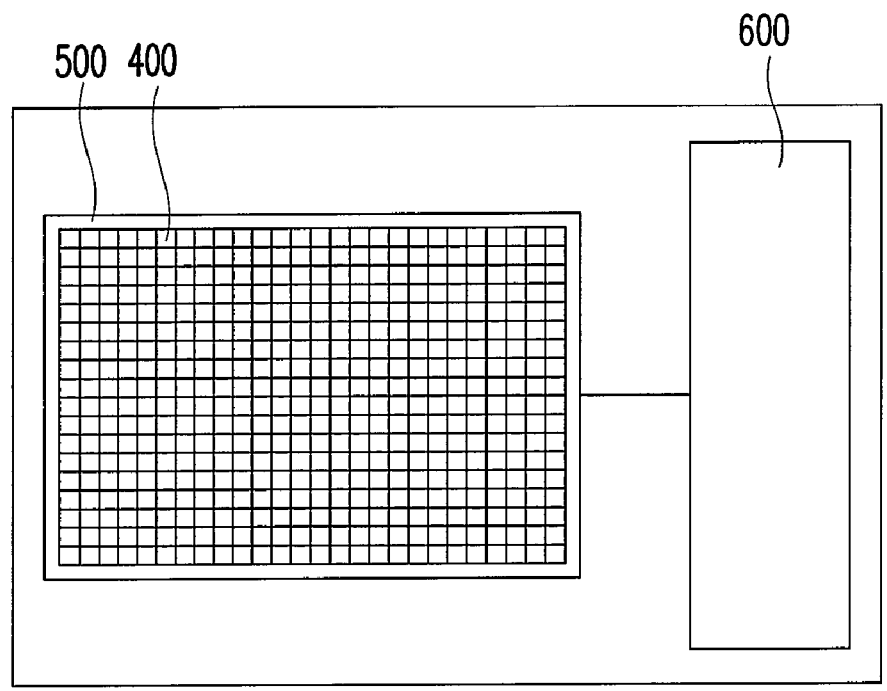
FIG. 4 is a schematic view illustrating an electro-optical device constituted by pixels driven by a TFT of the present invention.

Furthermore, as illustrated in FIG. 4, a display panel 500 constituted by an arranged array of pixels 400 driven by the TFTs 200 and 300 can be combined with an electronic device 600 to form a electro-optical device 700. The electronic device 600 includes a control device, an operating device, a processing device, an input device, a memory device, a driving device, a light-emitting device, a protection device, a sensing device, a detecting device, other devices having other functions, or any combination of the aforementioned. Types of the electro-optical device 700 include portable products (e.g., mobile phones, camcorders, cameras, electronic frames, laptop computers, game players, watches, music players, e-mail receivers and senders, map navigators, global positioning system (GPS), or the like), audio-video products (e.g., audio-video players or the like), screens, televisions, indoor/outdoor bulletins, panels in projectors, and so on. In addition, the display panel 500 includes LCDs, organic electro-luminescent display panels, and so on.

Although the present invention has been disclosed above by the embodiments, they are not intended to limit the present invention. Anybody ordinarily skilled in the art can make some modifications and alterations without departing from the spirit and scope of the present invention. Therefore, the protecting range of the present invention falls in the appended claims.

What is claimed is:

1. A dielectric layer, comprising:
   a film with a silicon compound containing oxygen; and
   a film with a silicon compound containing nitrogen, a ratio of Si—N group absorption intensity of the film with the silicon compound containing nitrogen in a Fourier transformation infrared (FTIR) spectrum to a thickness of the film with the silicon compound containing nitrogen substantially greater than or substantially equal to 0.67/μm.

2. The dielectric layer of claim 1, wherein a refractive index of the film a with a silicon compound containing nitrogen is substantially greater than 1.8.

3. The dielectric layer of claim 1, wherein a refractive index of the film with a silicon compound containing nitrogen ranges from about 1.84 to about 2.

4. The dielectric layer of claim 1, wherein a shrinkage stress of the film with a silicon compound containing nitrogen ranges from about 115 MPa to about −425 MPa.

5. The dielectric layer of claim 1, wherein the film with a silicon compound containing nitrogen is disposed on the film with silicon compound containing oxygen.

6. The dielectric layer of claim 1, wherein the film with a silicon compound containing oxygen is disposed on the film with silicon compound contain nitrogen.

7. A thin film transistor (TFT), comprising:
   a substrate;
   an active layer, disposed on the substrate, and having a source region, a drain region, and a channel region located between the source region and the drain region;
   a first dielectric layer, disposed on the substrate to cover the active layer;
   a gate, disposed on a portion of the first dielectric layer;
   a second dielectric layer, disposed on the substrate to cover the gate;
   a source/drain electrode, disposed on a portion of the second dielectric layer and electrically connected to the source region or the drain region of the active layer;
   a third dielectric layer, disposed on the substrate to cover the source/drain electrode; and
   a pixel electrode, disposed on a portion of the third dielectric layer and electrically connected to the source/drain electrode;
   wherein at least one of the first dielectric layer, the second dielectric layer, and the third dielectric layer comprises a film with a silicon compound containing oxygen and a film with a silicon compound containing nitrogen, and a ratio of Si—N group absorption intensity of the film with the silicon compound containing nitrogen in an FTIR spectrum to a thickness of the film with the silicon compound containing nitrogen is substantially greater than or substantially equal to 0.67/μm.

8. The TFT of claim 7, wherein a refractive index of the film with a silicon compound containing nitrogen is substantially greater than 1.8.

9. The TFT of claim 7, wherein a refractive index of the film with a silicon compound containing nitrogen ranges from about 1.84 about 2.

10. The TFT of claim 7, wherein a shrinkage stress of the film with a silicon compound containing nitrogen ranges from about 115 MPa to about −425 MPa.

11. The TFT of claim 7, wherein the film with a silicon compound containing nitrogen is disposed on the film with a silicon compound containing oxygen.

12. The TFT of claim 7, wherein the film with a silicon compound containing oxygen is disposed on the film with a silicon compound containing nitrogen.

13. The TFT of claim 7, further comprising a buffer layer disposed on the substrate.

14. The TFT of claim 13, wherein the buffer layer comprises a film with a silicon compound containing oxygen and a film with a silicon compound containing nitrogen, and the ratio of Si—N group absorption intensity to a thickness of the film with a silicon compound containing nitrogen in the FTIR spectrum of the film with a silicon compound containing nitrogen is substantially greater than or substantially equal to 0.67/μm.

15. The TFT of claim 14, wherein the film with a silicon compound containing nitrogen of the buffer layer is disposed on the film with a silicon compound containing oxygen of the buffer layer.

16. The TFT of claim 14, wherein the film with a silicon compound containing oxygen of the buffer layer is disposed on the film with a silicon compound containing nitrogen of the buffer layer.

17. A thin film transistor (TFT), comprising:
a substrate;
a gate, disposed on the substrate;
a first dielectric layer, disposed on the substrate to cover the gate;
an active layer, disposed on a portion of the first dielectric layer, and having a source region, a drain region, and a channel region located between the source region and the drain region;
a source/drain electrode, electrically connected to the source region or the drain region of the active layer;
a second dielectric layer, disposed on the substrate to cover the source/drain electrode, the active layer and the first dielectric layer; and
a pixel electrode, disposed on a portion of the second dielectric layer and electrically connected to the source/drain electrode;
wherein at least one of the first dielectric layer and the second dielectric layer comprises a film with a silicon compound containing oxygen and a film with a silicon compound containing nitrogen, and a ratio of Si—N group absorption intensity of the film with the silicon compound containing nitrogen in an FTIR spectrum to a thickness of the film with the silicon compound containing nitrogen is substantially larger than or substantially equal to 0.67/μm.

18. The TFT of claim 17, wherein a refractive index of the film with a silicon compound containing nitrogen is substantially larger than 1.8.

19. The TFT of claim 17, wherein a refractive index of the film with a silicon compound containing nitrogen ranges from about 1.84 to about 2.

20. The TFT of claim 17, wherein a shrinkage stress of the film with a silicon compound containing nitrogen ranges from about 115 MPa to about −425 MPa.

21. The TFT of claim 17, wherein the film with a silicon compound containing nitrogen is disposed on the film with a silicon compound containing oxygen.

22. The TFT of claim 17, wherein the film with a silicon compound containing oxygen is disposed on the film with a silicon compound containing nitrogen.

23. The TFT of claim 17, further comprising an etching stop layer disposed under a portion of the source/drain electrode and substantially corresponding to the gate.

24. The TFT of claim 23, wherein the etching stop layer comprises a film with a silicon compound containing oxygen and a film with a silicon compound containing nitrogen, and the ratio of Si—N group absorption intensity to a thickness of the film with a silicon compound containing nitrogen in the FTIR spectrum of the film with a silicon compound containing nitrogen is substantially greater than or substantially equal to 0.67/μm.

25. The TFT of claim 24, wherein the film with a silicon compound containing nitrogen of the etching stop layer is disposed on the film with a silicon compound containing oxygen of the etching stop layer.

26. The TFT of claim 24, wherein the film with a silicon compound containing oxygen of the etching stop layer is disposed on the film with a silicon compound containing nitrogen of the etching stop layer.

27. The TFT of claim 17, further comprising a buffer layer disposed on the substrate.

28. The TFT of claim 27, wherein the buffer layer comprises a film with a silicon compound containing oxygen and a film with a silicon compound containing nitrogen, and the ratio of Si—N group absorption intensity to a thickness of the film with a silicon compound containing nitrogen in the FTIR spectrum of the film with a silicon compound containing nitrogen is substantially greater than or substantially equal to 0.67/μm.

29. The TFT of claim 28, wherein the film with a silicon compound containing nitrogen of the buffer layer is disposed on the film with a silicon compound containing oxygen of the buffer layer.

30. The TFT of claim 28, wherein the film with a silicon compound containing oxygen of the buffer layer is disposed on the film with a silicon compound containing nitrogen of the buffer layer.

31. A display panel, comprising the TFTs of claim 7 and a plurality of signal lines electrically connected to the TFTs.

32. A electro-optical device, comprising the display panel of claim 31.

33. A display panel, comprising the TFTs of claim 17 and a plurality of signal lines electrically connected to the TFTs.

34. A electro-optical device, comprising the display panel of claim 33.

35. A display panel, comprising the TFTs of claim 23 and a plurality of signal lines electrically connected to the TFTs.

36. A electro-optical device, comprising the display panel of claim 35.

* * * * *